United States Patent [19]

Sorel

[11] Patent Number: 4,688,864
[45] Date of Patent: Aug. 25, 1987

[54] ELECTRONIC CIRCUIT CONSTITUTED BY STACKABLE MODULES

[75] Inventor: Alain Sorel, Evreux, France

[73] Assignee: U.S. Philips Corporation, New York, N.Y.

[21] Appl. No.: 845,653

[22] Filed: Mar. 28, 1986

[30] Foreign Application Priority Data

Apr. 5, 1985 [FR] France ................................ 85 05263

[51] Int. Cl.[4] .............................................. H01R 9/09
[52] U.S. Cl. ........................................ 439/74; 361/394
[58] Field of Search .......... 339/17 CF, 17 M, 17 LM; 361/393, 394, 395

[56] References Cited

U.S. PATENT DOCUMENTS

| | | | |
|---|---|---|---|
| 3,454,921 | 7/1969 | Coleman et al. | 339/17 CF |
| 3,643,135 | 2/1972 | Devore et al. | 361/394 |
| 3,818,414 | 6/1974 | Davies et al. | 339/59 M |
| 4,437,718 | 3/1984 | Selinko | 339/17 CF |

Primary Examiner—Neil Abrams
Attorney, Agent, or Firm—Jack E. Haken; James J. Cannon, Jr.

[57] ABSTRACT

Stackable modules for electronic subsystems, which are all mechanically identical, but functionally different, which can be disassembled and rearranged. Each module has a housing of two parts, in which an electronic circuit is fixed and which has openings, through which the electronic circuit is electrically accessible. It has recesses for fixing a rod provided with metallic wires, which ensure contacts with the electric circuit and project beyond the exterior of the housing. When several housings are assembled, the wires, which project beyond the exterior of each housing, are in contact with the electronic circuit of the adjacent housing via the openings of the latter.

6 Claims, 7 Drawing Figures

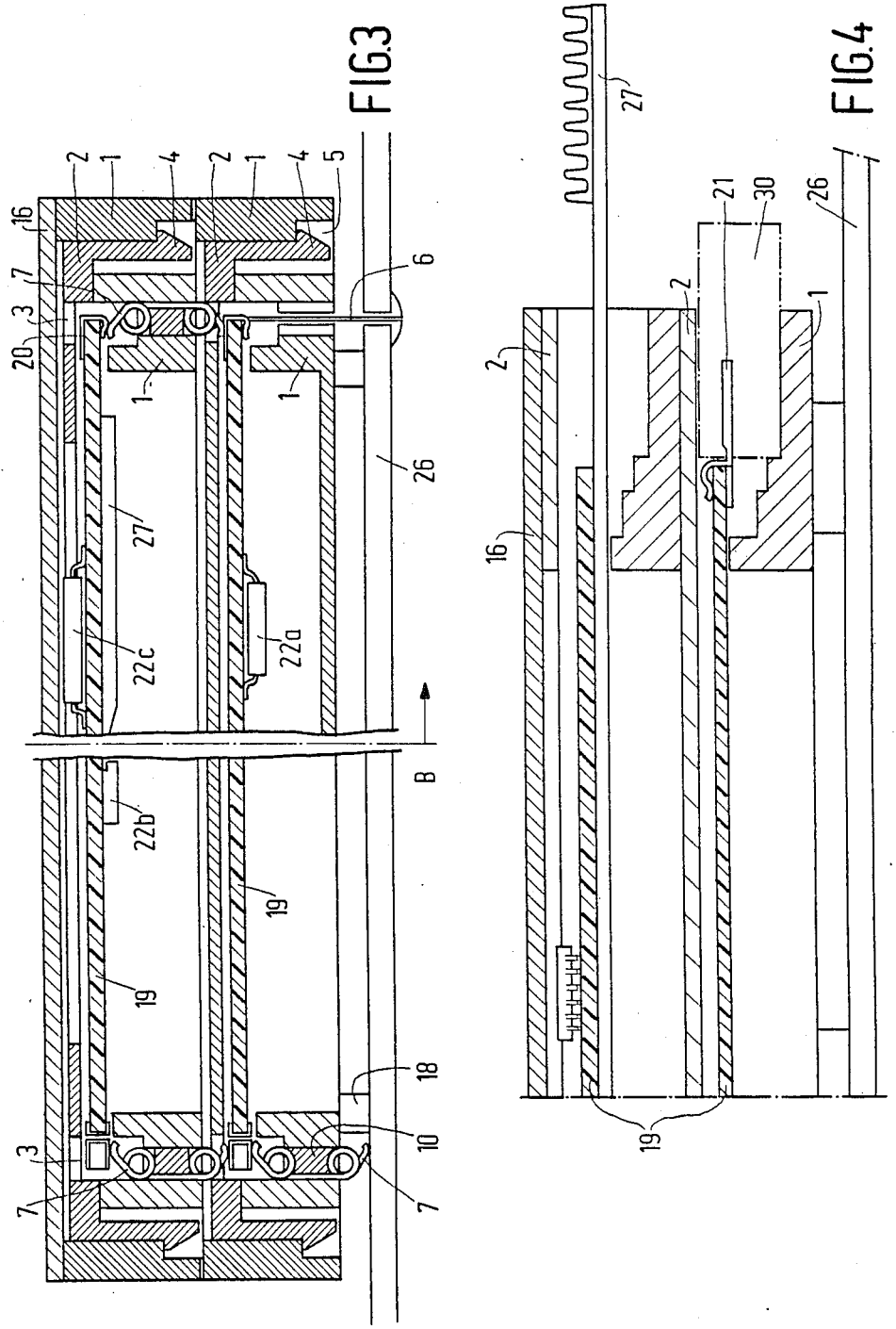

ELECTRONIC CIRCUIT CONSTITUTED BY STACKABLE MODULES

BACKGROUND OF THE INVENTION

The invention relates to a system constituted by electronic modules attached to each other, thus forming a stack that can comprise functionally different modules of all kinds electrically interconnected for transmitting signals between them and to the exterior, the said stack being fixed, for example, to a printed circuit card, a so-called master card, each module comprising an electric circuit constituted by components wired on a flat rectangular support and provided with contact regions along at least one of its sides and arranged in a flat insulation housing provided with means for holding in place both the circuit and a plurality of electric conductors independent of the circuit, an electric conductor each time corresponding to a region of the support and being pressed against it, the said housings all being mechanically identical to each other and being provided with means for securing them to each other. Such modules are used in an electronic system when the systems have to be readily adapted so that they can satisfy specific needs of the user, have to provide the possibility of being increased according to the variable needs of the user and have to provide the possibility of being readily modified. These modules can therefore be rapidly added to a system or withdrawn from a system in order to modify the latter.

Such a system is described in an article of Jan. 1$^{st}$ 1985 in the magazine "Electronics Week", pages 97,98, entitled "Domino-like Modules build Computers" and represented by the photograph accompanying this article. A system of the same kind is described in greater detail in U.S. Pat. No. 4,045,105. These systems are based on the use of pins and sleeves, which are complex and comparatively expensive; moreover, these pins introduce intermediate contacts between two adjacent circuits, which increases the resistance of the connections and decreases the reliability.

SUMMARY OF THE INVENTION

The invention has for its object to provide an embodiment of such a system, in which circuits, such as printed circuits or so-called hybrid substrates comprising thick layers or thin layers are used, on which the whole of the components used can be mounted in a single step according to a standard technology.

The invention provides housings specifically adapted to the mechanical construction of the circuit and to their interconnection and which ensure a maximum of interchangeability, of density and of modularity and permit of obtaining a high degree of flexibility as to the specific inputs/outputs of each circuit and the power they can dissipate.

It furthermore permits of obtaining connections between adjacent substrates, which, while remaining immediately dismountable, have a very high electric resistance and a high degree of reliability.

The system according to the invention is more particularly characterized in that, the said support being rectangular and being provided with contact regions along at least one of its sides, to each contact region on one surface of the support corresponds a region situated opposite thereto on the other surface and connected electrically thereto, in that the housing permits the said electric conductors to project beyond a single surface and is provided with openings situated on the other surface and permitting the appearance of certain regions of the support, and in that by means of the said conductors, whose end is elastic, contacts are directly established between the regions of a circuit arranged in a housing and those of another circuit arranged in another housing, these regions being themselves located opposite each other when the housings are attached.

The said plurality of electric conductors is advantageously constituted by elastic wires of electrically conducting material, which are insulated from each other and held together in an aligned position by an insulating rod, the housing having a recess for holding in place said insulating rod with its conductors.

The electric conductors are advantageously made of spring wire and comprise helical springs each wound over at least one turn. Moreover, the insulating rods have between the two helical springs of each conductor a part in the form of a dovetail for holding the conductor in place.

According to a particular embodiment, in which at least one circuit is provided with a radiator plate, this plate projects beyond the exterior of the circuit on the side which does not comprise contact regions and the housings are provided with an opening corresponding to this plate, through which the latter can project beyond the exterior.

According to another particular embodiment, in which at least one circuit transmits or receives certain signals exclusively to the exterior or from the exterior, the support has connections along a side which does not serve for cooling and for contact either to the other modules via the aforementioned conductors and the housings have an opening corresponding to this side, through which a conductor can be introduced.

The invention more particularly relates to a system for industrial use provided with a microprocessor, characterized in that its central unit, its memory modules and its input/output connection interfaces are each constituted by a module in accordance with the invention.

BRIEF DESCRIPTION OF THE DRAWINGS

In order that the invention may be readily carried out, it will now be described more fully, by way of example, with reference to the accompanying drawing, in which:

FIG. 3 is a sectional view of a stack of two modules,

FIG. 4 is another sectional view of the same stack of modules, and

DESCRIPTION OF THE PREFERRED EMBODIMENTS

Figure 1:
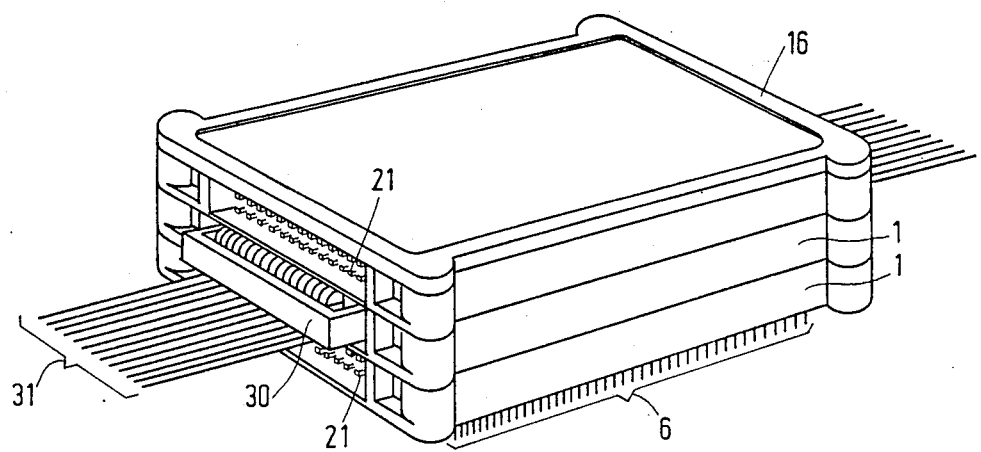
FIG. 1 is a perspective view of an electronic system according to the invention.

The system shown in FIG. 1 is obtained by superimposing three mechanically identical modules 1 so as to form a stack that can comprise all kinds of functionally different modules.

The lower module in this case is different from the two other modules and comprises pins 6 for connection to a basic printed circuit. As will be seen below, this disposition is not absolutely necessary. Lateral openings provided with pins 21 permit of branching a conductor 30, on which a flat conductor layer 31 is wired. A cover 16 covers and protects the assembly. It can be immediately removed in order to add another module and to replace the latter.

Figure 2:
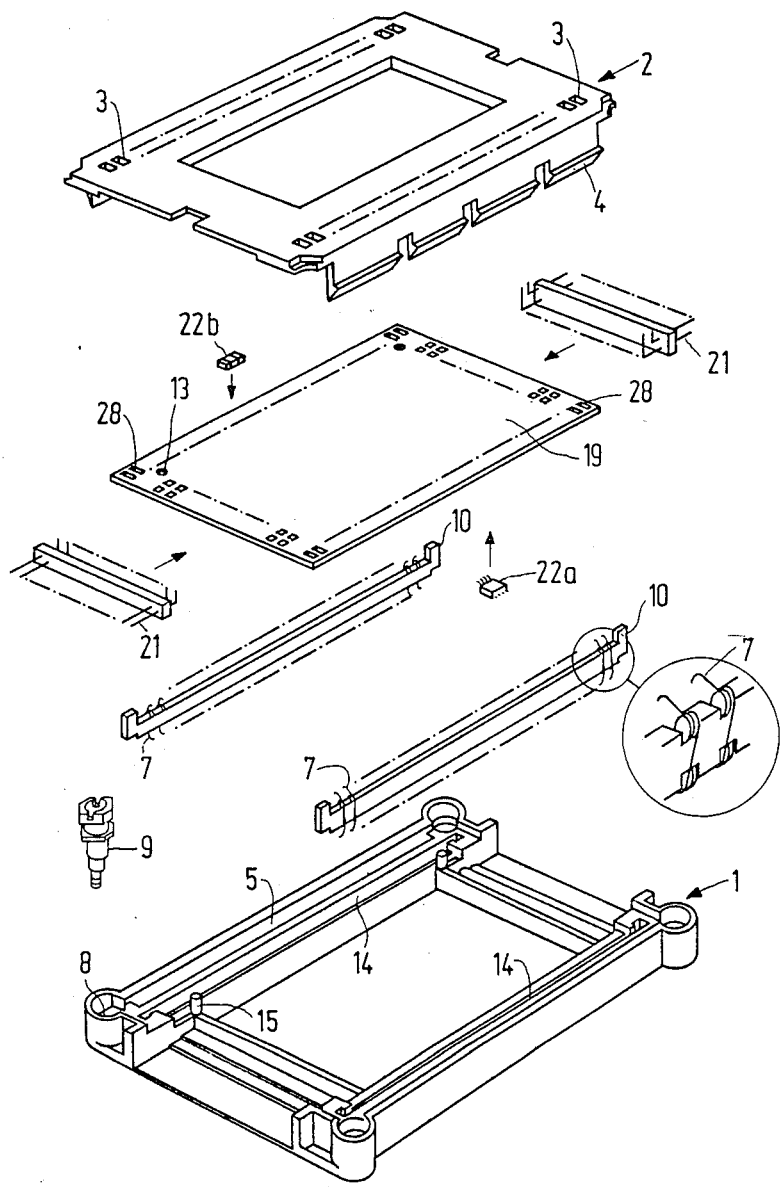
FIG. 2 shows an exploded view of an elementary module of the system.

The components of a module according to the invention are shown in detail in FIG. 2. The manner in which they are assembled will appear below in the description of FIG. 3.

The different modules are electrically interconnected in order to transmit signals. The transmission of the signals between adjacent modules is effected by means of metal wires 7, which project beyond the exterior of the module through a slot 14. Screws 9 and hollow columns 8 are provided for attaching the modules to each other. The module shown in FIG. 2 is constituted by a flat housing 1 of insulating material, which is provided with the slot-shaped opening 14 and with a cover 2 also of insulating material.

The cover 2 itself is fixed to the housing by means of hooks 4, which enter into passages 5. The assembly of a stack of such modules is adapted so as to be fixed itself to a printed circuit plate designated as "master card", with which contact can be established by means of the same metal wires 7, which enter into contact with the regions of the printed circuit master card. From the upper part of FIG. 2, there are successively represented a cover 2, an electronic circuit constituted by components 22 wired on a flat printed support 19 and a rod 10 provided with metal contact wires 7 constituting a plurality of electric conductors independent of the circuit. For the sake of simplicity, four wires are shown in the drawing, but it is quite clear that the rod is provided with such wires throughout its length. A housing 1 is finally shown. The housing 1 shown here is in the form of a frame and the cover is opened by means of a large groove in order to obtain access to the circuit 19. The housing could of course also be closed completely. The rectangular support 19 is provided with contact regions 28 along its two major sides, while to each contact region on one surface of the support corresponds a region arranged opposite to it on the other surface. If this support 19 is a printed circuit, the oppositely arranged regions can be joined together through a metallized hole, which may be situated, for example, at the edge of these regions. These oppositely arranged regions may also be electrically interconnected by jumper leads (not shown) which are arranged in upright position on the plate of the substrate of the type used for the connections of the ceramic circuits comprising thick layers, these connections being supplied in the form of ribbon by a certain number of manufacturers. This interface connection technique is advantageously used when the support 19 is a ceramic substrate comprising, for example, thick layers.

The cover 2 is provided with openings 3, through which the regions 28 of the support 19 can be accessible from the outside of the module, that is to say in FIG. 2 from the upper part of the cover 2. The cover is provided with two times four hooks 4, which penetrate into the passages 5 of the housing 1 in order to fix to each other the cover and the housing. The housing 1 is itself provided with hollow columns 8 intended to attack the module shown and an adjacent module to each other so as to form a stack. Screws 9 penetrate through the columns 8 and the screw of the adjacent module can be screwed into their hollow head. The housing 1 is provided with slots 14, in which the rod 10 is positioned.

This rod 10 supports a plurality of electrical conductors 7 constituted by elastic wires of electrically conducting material insulated from each other and held together in an aligned position by the rod. When the rod 10 is mounted in the slot 14 and the support 19 is mounted in the housing 1 and fixed by means of pins 15 entering into the holes 13 and is, for example, hot-pressed, the conductors constituted by elastic wires 7 each correspond to a region of the support 19 and are in electrical contact therewith. This contact is established by a proportioning of the assembly which ensures that the wires 7 are pressed against the regions situated in this case under the substrate 19 corresponding to the regions 28. (This disposition is shown in FIG. 3, which is a sectional view taken on a plane perpendicular to the rods 10). The other end of the wires (with respect to that end which is pressed against the regions) projects beyond the exterior of the housing 1 and can penetrate through the openings of the cover of an adjacent housing so as to enter into contact with the regions of a support 19 contained in the adjacent housing. Thus, the contacts are established by means of the conductors 7 between the regions of a circuit arranged in a housing and those of another circuit arranged in another housing, a conductor corresponding to a region of the support and the regions of one housing with respect to those of another housing being arranged oppositely. It is also conceivable to form the wires 7 directly with the housing 1 by moulding without using rods 10. However, this would involve great difficulty with respect to moulding and especially the partial embedding of the wires in the material would make them in elastic. Therefore, the disposition described with the rods 10 is more favorable. One side of the support 19, which does not carry the regions 28 intended to interconnect the modules, can be utilized for arranging there the connection pins 21, which project beyond the exterior of the housing and can be connected to a connector plugged into a suitable opening on the side of the housing. This connector ensures a communication only with the corresponding module stage in the stack, in an information system, the bus would be transported by an assembly of vertical connections between one module and the other ensured by the metal wires and the specific inputs/outputs at each stage would be obtained via the pins 21.

On the two sides of FIG. 3, the hooks 4 mentioned above are shown, which permit of hooking the cover 2 and the housing 1 to each other. The rods 10 are shown in sectional view and the Figure illustrates the manner in which the wires 7 enter into contact with the jumper leads 20 mentioned above in upright position on the edges of the ceramic circuits 19 (in the righthand part of the Figure) or with regions connected to each other through a metallized hole of the printed circuit (in the lefthand part of the Figure). A printed circuit will be chosen having a thickness slightly exceeding that of the equivalent ceramic support in order to compensate for the absence of the jumper leads 20, whose thickness is not negligible and to attain the same overall thickness between the oppositely arranged contacts. The Figure further shows how the wires 7 penetrate through the cover of the lower module so as to be pressed against the jumper leads or the regions of the electronic circuit of the latter, as they are also pressed against the master card 26 (in the lefthand part of the Figure) and how the regions of the circuit of the upper module are accessible through openings 3. A cover 16 is shown, whose secondary function is to close the upper end of the upper module of the stack in order to protect its electronic circuit. The housing shown in the lower part and in the righthand part and its cover are of a closed design, as mentioned above.

In the lower part and in the righthand part, a particular method of connecting the circuit to a base plate 26 by means of pins 6 of a known type is shown. The connection may also be obtained, as shown in the lefthand part, by the wires 7. Components 22a, b, c are represented so as to be fixed to the supports of electronic circuits in order to indicate various possibilities of mounting on the said supports. Moreover, a thermally conducting metallic region 27 may be fixed under such a support in order to dissipate heat from it.

FIG. 4 shows a sectional view taken on the line B of FIG. 3. It permits of clearly understanding how the radiator 27 projects beyond one end of the support 19, which does not comprise contact regions as far as the exterior of the housing, while passing through an opening of the housing. This opening is the same as that into which the aforementioned connector plugged on the side of the housing can be introduced. The radiator can be provided with cooling fins on the outer side of the housing. Further, at the lower stage of the stack, output pins 21 are shown, while a connector 30 is indicated by a dotted line.

Figures 5A, 5B, 5C:
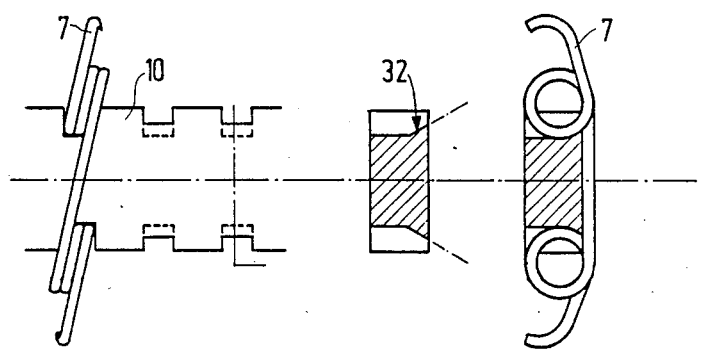
FIG. 5 shows on a larger scale a rod part 10 and a conductor 7 of FIG. 2.

FIG. 5 shows a rod element 10 with a conductor 7 made of spring wire. Each wire 7 has two helical springs wound in this case over two turns. These wires in the form of helical springs permit of obtaining a large elastic displacement amplitude of the end of the wire and render it possible to establish a very good contact, even with large mechanical tolerances. FIG. 5b shows in sectional view the rod 10 with the assembly of a conductor; it has a part 32 in the form of a dovetail, which penetrates between the helical spring and the vertical part of the wire (Fig. 5c) and efficaciously holds the latter in place.

The modules according to the invention are advantageously used to constitute a microdata assembly provided with a microprocessor, its central unit being mounted in one of the modules and a memory being mounted in another module, an input/output interface, for example with a conversational terminal or with a sensor or a machine actuator being situated in a specific module, and more generally each functional subassembly being constituted by a distinct module. Thus, any configuration can be formed according to need and can be very readily rearranged by joining together modules according to the invention.

What is claimed is:

1. An arrangement of electronic modules attached to each other, thus forming a stack, said modules having a mechanically identical flat insulating housing, said stack being provided with means connectable to a printed circuit master card, each module comprising a flat rectangular support for an electronic circuit, said support being provided with contact regions along at least one of its sides, each contact region present on a first main surface of said support being electrically connected to a corresponding contact region on a second main surface of said support, said housing having an outer surface on opposite sides of said support and being provided with means for holding in place a plurality of electric conductors, each of said electric conductors corresponding to a said contact region of said support, said electric conductors having two elastic ends one of which presses against a said contact region on said first main surface of the support, the other end projecting beyond a first outer surface of said housing, said housing having openings situated on a second outer surface, which openings give access to said contact regions on said second main surface of said support, so that, when modules are attached to each other, the ends of said electric conductors which project beyond said first outer surface of said housing of a module enter into said openings on a second outer surface of an adjacent module and press against contact regions on a second main surface of said support of said adjacent module, thus arranging connections between said contact regions of a first circuit arranged in a first housing and those of a second circuit arranged in a second housing.

2. An arrangement as claimed in claim 1, characterized in that said plurality of electrical conductors is constituted by elastic wires of an electrically conducting material insulated from each other and held together in an aligned position by an insulating rod, and in that the housing has a recess for holding in place said insulating rod with its conductors.

3. An arrangement as claimed in claim 2, wherein said electrical conductors are made of spring wire and comprise helical springs, each wound over at least one turn.

4. An arrangement as claimed in claim 3, characterized in that said insulating rods have a dovetail shaped part between two helical springs of each conductor for holding said electrical conductor in place.

5. An arrangement as claimed in claim 2, characterized in that each housing is composed of two parts, one of which has at least one recess in the form of a slot along one exterior side for said rod and its elastic conductors supporting said electric circuit, while a second part has openings through which regions of said circuit are accessible.

6. An arrangement as claimed in any one of claims 1 or 2 through 5, in which at least one circuit is provided with a thermally conducting plate, characterized in that this plate projects beyond the exterior of the circuit on a side which does not comprise contact regions, and in that the housings are provided with an opening corresponding to said plate, through which it can project beyond the exterior.

* * * * *